United States Patent
Cappello et al.

(10) Patent No.: US 11,444,578 B2
(45) Date of Patent: Sep. 13, 2022

(54) SINGLE-SUPPLY MULTI-LEVEL ENVELOPE TRACKER FOR RF POWER AMPLIFIER EFFICIENCY ENHANCEMENT

(71) Applicants: The Regents of the University of Colorado, a body corporate, Denver, CO (US); Alma Mater Studiorum—Università di Bologna, Bologna (IT)

(72) Inventors: Tommaso Cappello, Boulder, CO (US); Corrado Florian, Ozzano dell'Emilia (IT); Zorana Popovic, Boulder, CO (US)

(73) Assignee: The Regents of the University of Colorado, a body corporate

( * ) Notice: Subject to any disclaimer, the term of this patent is extended or adjusted under 35 U.S.C. 154(b) by 75 days.

(21) Appl. No.: 17/053,679

(22) PCT Filed: May 7, 2019

(86) PCT No.: PCT/US2019/031047
§ 371 (c)(1),
(2) Date: Nov. 6, 2020

(87) PCT Pub. No.: WO2019/217372
PCT Pub. Date: Nov. 14, 2019

(65) Prior Publication Data
US 2021/0119582 A1    Apr. 22, 2021

Related U.S. Application Data
(60) Provisional application No. 62/668,028, filed on May 7, 2018.

(51) Int. Cl.
| H03F 1/30 | (2006.01) |
| H03F 1/02 | (2006.01) |
| H03F 3/24 | (2006.01) |

(52) U.S. Cl.
CPC .......... *H03F 1/0227* (2013.01); *H03F 3/245* (2013.01); *H03F 2200/451* (2013.01)

(58) Field of Classification Search
CPC .................................. H03F 1/30; H03F 1/02
(Continued)

(56) References Cited

U.S. PATENT DOCUMENTS 8,957,727 B2 *  2/2015  Dawson .................. H03F 3/602
                                                      330/124 R
9,203,347 B2 * 12/2015  Jiang ........................ H03F 3/19
(Continued)

*Primary Examiner* — Henry Choe
(74) *Attorney, Agent, or Firm* — Macheledt Bales LLP; Jennifer L. Bales

(57) ABSTRACT

A multi-level supply modulator for RF power amplifiers requires only a single independent voltage supply along with one or more flying capacitors to achieve multiple output levels. The flying capacitor is used to store the intermediate voltage level between the DC supply level and ground. A switch network is connected between the DC voltage supply and the power amplifier and is configured to provide power at variable, discrete DC voltages, for example the DC voltage supply level, ground, and a level halfway between the DC voltage supply level and ground. The flying capacitor is connected to switches in the switch network, and a sensing circuit detects the voltage across the flying capacitor and generates a feedback signal. Control circuitry controls the switch network (and thus the power supplied to the amplifier) based on the feedback signal.

14 Claims, 10 Drawing Sheets

(58) Field of Classification Search
USPC .................................................. 330/297, 296
See application file for complete search history.

(56) References Cited

U.S. PATENT DOCUMENTS

| | | | |
|---|---|---|---|
| 9,247,496 B2* | 1/2016 | Khlat | ........................ H03F 3/72 |
| 2011/0084757 A1 | 4/2011 | Saman | |
| 2016/0065138 A1* | 3/2016 | Briffa | ....................... H04B 1/04 |
| | | | 330/297 |

* cited by examiner

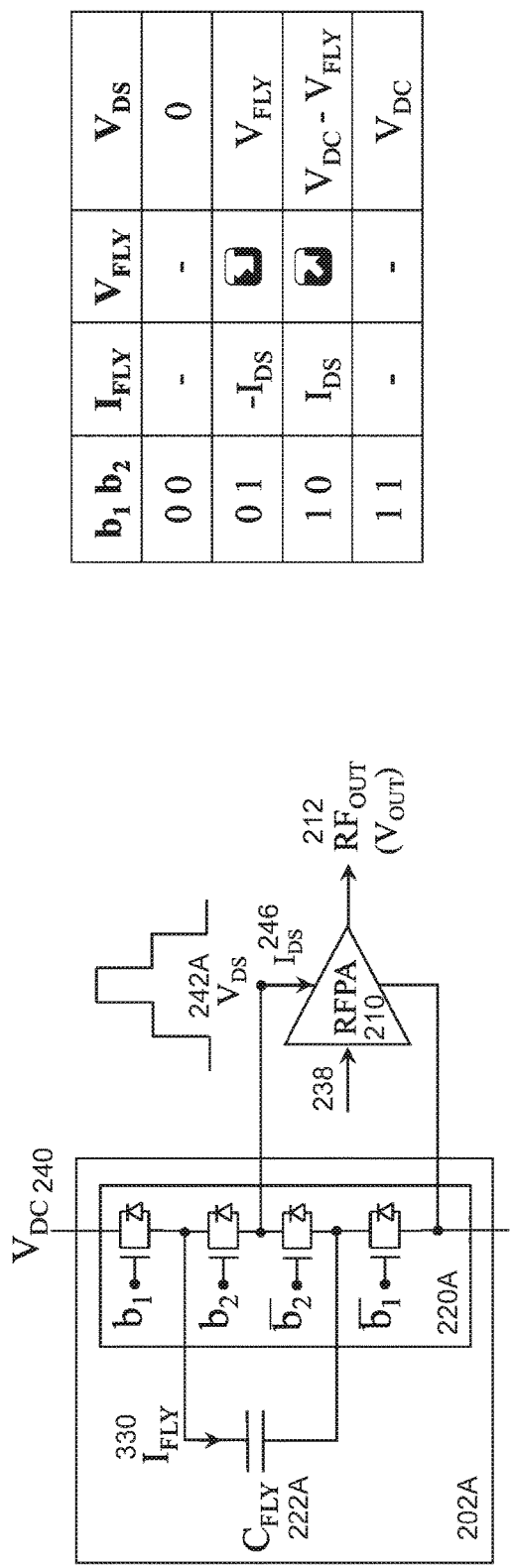
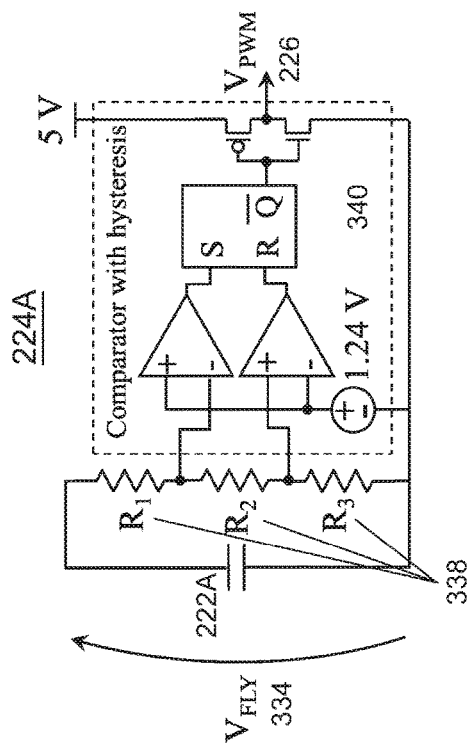
Figure 3A
Figure 3B
Figure 3C

SINGLE-SUPPLY MULTI-LEVEL ENVELOPE TRACKER FOR RF POWER AMPLIFIER EFFICIENCY ENHANCEMENT

BACKGROUND OF THE INVENTION

Field of the Invention

The present invention relates to supply modulated RF power amplifiers. In particular, the present invention relates to single-supply multi-level RF power amplifier supply modulation using envelope tracking.

Discussion of Related Art

Currently, RF power supplies used in, for example, telecommunications applications are very power inefficient. Efficiency of RF power amplifiers has been improved somewhat by means of envelope tracking architecture. The overall efficiency of the supply-modulated power amplifier can be increased if the efficiency of the supply modulator is good enough. The efficiency of the power supply is equally important for overall efficiency of the envelope tracking transmitter. Therefore, in envelope tracking architectures, the power converter, which, in the case of fixed bias is a conventional high efficient DC/DC switching converter, has been replaced by a supply modulator with very demanding specifications in terms of bandwidth, linearity, and dynamics, and with the highest possible conversion efficiency.

Envelope tracking is applied to communications and radar transmitters to improve back-off efficiency when waveforms with high peak-to-average power ratios (PAPRs) are amplified. In communications, continuous or discrete supply modulation has shown to significantly increase the back-off efficiency. In pulsed radars, the RF power amplifier (PA) can be operated with a variable drain supply to reduce dissipation in the case of amplitude modulated pulses, used to reduce time sidelobes and simultaneously improve spectral confinement.

Ideally, continuous envelope tracking maximizes PA efficiency for every output power level. However, this requires either a linear voltage regulator, usually aided by a switching circuit for efficiency, or multiple voltage sources multiplexed at the PA drain. Applying multiple discrete voltage levels has the advantage of efficiency when implemented with power switches, at the expense of hardware complexity that requires additional voltage supplies for high-resolution voltage discretization. The losses of the external voltage supplies should be accounted for a realistic assessment of the total power budget of a supply-modulated PA.

Several examples of supply modulators for envelope tracking applications can be found in the literature, aiming at the maximization of bandwidth and efficiency. These designs basically belong to three possible architectures (or combination of them) which are shown in FIGS. 1A, 1B, and 1C (Prior Art). FIG. 1A shows a linear-assisted switching converter, which is the least efficient with wideband signals. The efficiency depends on the spectral distribution of required dynamic supply voltage, which is directly related to the spectral characteristics of the RF signal envelope: for this reason, very good performances are achieved when only a very small fraction of the output power, amplified by the linear part, is located beyond the bandwidth of the switching amplifier.

FIG. 1B shows a multi-phase switching converter requiring a bulky filter. A large number of circuits has to be used to obtain multi-MHz responses; hence the circuit cost and complexity become considerable. The main challenges in single- and multi-phase supply modulators are associated with the required design of the output filter. Indeed, the filter is not loaded by a fixed resistor but by the power amplifier, which presents a dynamic nonlinear impedance load.

FIG. 1C shows a multi-level switching converter. This is the most promising architecture, but requires a separate, independent DC voltage source for each output level (e.g. four levels require four supplies).

A need remains in the art for a multi-level envelope tracker requiring only a single supply for the multiple output levels.

SUMMARY OF THE INVENTION

It is an object of the present invention to provide a multi-level supply modulator for RF amplifiers requiring only a single independent voltage supply to achieve multiple output levels. A single DC voltage supply along with (for example) two flying capacitors provides capability for four output voltage levels while ensuring balanced voltage among the flying capacitors. Four level operation guarantees required redundancy of levels when a non-regenerative load is used, such as power amplifier. A feedback loop can be implemented with an DSP/FPGA to ensure the floating capacitors maintain their chosen voltage (for each output level) with only a small amount of ripple.

Supply modulation of a PA together with additional voltage level generation starts from a single-dc-input supply. A flying capacitor is used to store the intermediate voltage level, but rather than using a filter on the output to smooth the drain voltage, digital pre-distortion (DPD) is used to recover linearity of the PA.

A multi-cell supply modulator for providing variable-voltage DC power to an RF power amplifier comprises a single independent DC voltage supply supplying power at a DC supply voltage, a switch network connected between the DC voltage supply and the power amplifier and configured to provide power at variable, discrete DC voltages to the power amplifier, a flying capacitor connected to switches in the switch network, a sensing circuit for detecting a flying voltage across the flying capacitor and providing a feedback signal based on the flying voltage, and control circuitry for controlling the switch network based upon the feedback signal. The switch network is configured to provide at least three different DC voltage levels to the RF power amplifier. For example the variable discrete DC supply voltages could substantially vary between the DC supply voltage, a ground voltage, and a level halfway between the DC supply voltage and the ground voltage. The sensing circuit might be a comparator with hysteresis.

The supply modulator could include a second flying capacitor connected to switches in the switch network. The switch network is then configured to provide at least four different DC voltage levels to the RF power amplifier. The switch network might comprise three nested half bridges or three series half bridges.

To generalize, the supply modulator can comprise N half bridges and N−1 flying capacitors, in which case the switch network is configured to provide at least N+1 different DC voltage levels to the RF power amplifier.

It is often convenient to integrate the switch network, the flying capacitor, and the sensing circuit on a single chip, e.g. with GaN architecture. Generally a digital baseband is configured to supply an IF signal to be upconverted to RF and amplified by the RF amplifier. The digital baseband may also perform digital predistortion on the IF signal. in some embodiments, the control logic and the digital baseband comprise a digital baseband processor.

BRIEF DESCRIPTION OF THE DRAWINGS

FIG. 3A is a schematic block diagram of a three-level multicell supply modulator with a flying capacitor according to the present invention. FIG. 3B is a diagram of circuit operation of the embodiment of FIG. 3A. FIG. 3C is a schematic block diagram of an embodiment of a sensing circuit for use with a modulator such as that shown in FIG. 3A.

DETAILED DESCRIPTION OF THE INVENTION

Table 1 below shows reference numbers and their associated elements.

TABLE 1

| Ref. No. | Element |
| --- | --- |
| 200 | Conceptual block diagram of invention |
| 202 | Flying capacitor multicell supply modulator |
| 204 | Digital baseband processor |
| 206 | Upconverter |
| 208 | Driver |
| 210 | RF power amplifier |
| 212 | RF output ($V_{OUT}$) |
| 220 | Switch network |
| 222 | Flying capacitor(s) |

TABLE 1-continued

| Ref. No. | Element |
| --- | --- |
| 224 | $V_{FLY}$ Voltage sensing |
| 226 | Feedback signal ($V_{PWM}$) |
| 228 | Command (switch configuration signal) |
| 230 | Control logic |
| 234 | IF signal |
| 236 | Carrier frequency |
| 237 | RF signal (before amplification) |
| 238 | $RF_{IN}$ (microwave signal to be amplified) PA input signal |
| 240 | VDC (single supply) generates $V_{DC}$ |
| 242 | $V_{DS}(t)$ (variable drain voltage) |
| 244 | Ground |
| 246 | $I_{DS}$ |
| 320 | Switches |
| 324 | Circuit operation diagram |
| 328 | Flying capacitor sensing circuit |
| 334 | $V_{FLY}$ |
| 338 | Resistors in series |
| 340 | Comparator with hysteresis |

Figure 1A:
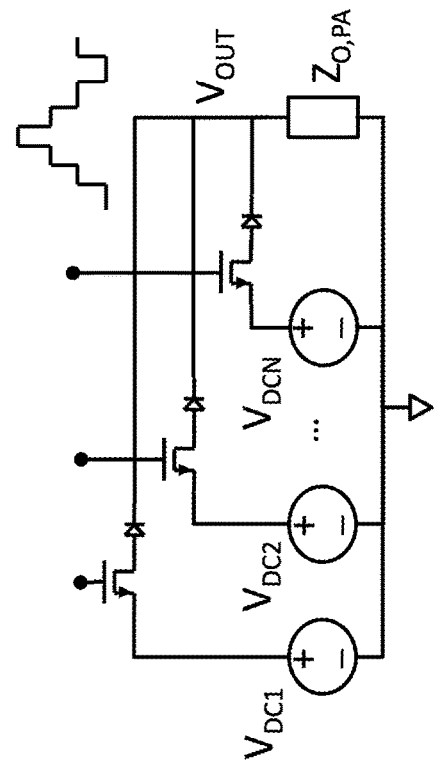
FIG. 1A (Prior Art) is a schematic block diagram of a linear-assisted switching converter.
Figure 1B:
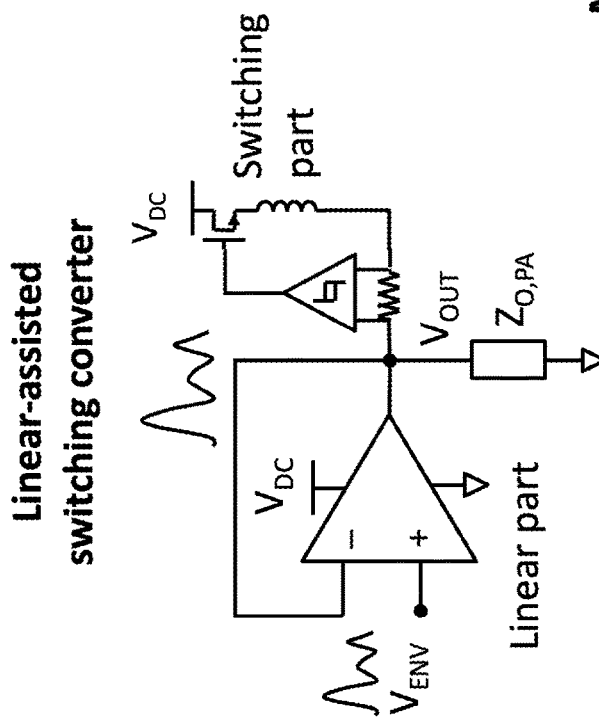
FIG. 1B (Prior Art) is a schematic block diagram of a multi-phase switching converter.
Figure 1C:
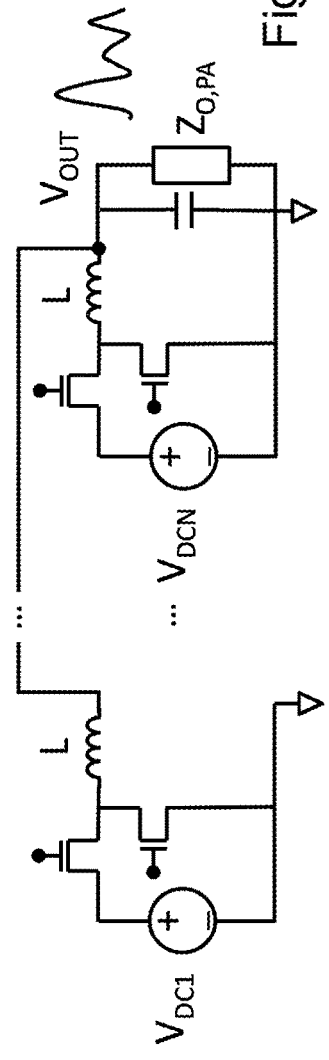
FIG. 1C (Prior Art) is schematic block diagram of a multi-level switching converter.
Figure 2:
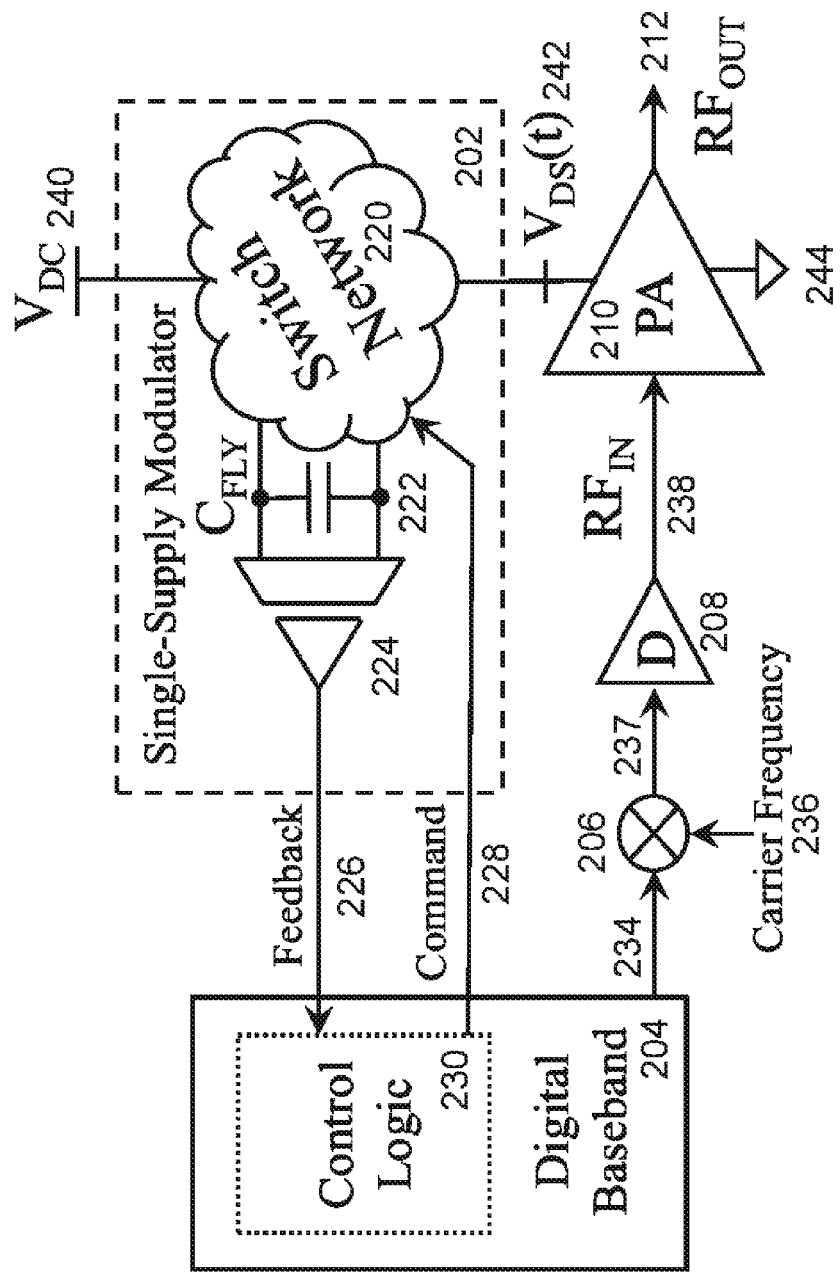
FIG. 2 is a conceptual schematic diagram of a single-supply multi-level envelope tracker according to the present invention.

FIG. 2 is conceptual block diagram of a single-supply multi-level envelope tracker 200. It illustrates the control technique enabling single-supply discrete envelope tracking of RF power amplifiers (PAs) using a flying capacitor multicell supply modulator 202. In place of multiple external supplies, a flying capacitor 222 ($C_{FLY}$) is used to store the voltage level, and control logic 230 keeps the voltage regulated to a set-point. A switch network 220 is fed by a single dc supply 240 ($V_{DC}$) and generates an intermediate voltage level 242 ($V_{DS}(t)$) for back-off efficiency enhancement. In the present invention, this intermediate voltage is directly derived from $V_{DC}$ through the commutations of switch network 220, by storing energy in flying capacitor 222. The voltage 334 (See FIG. 3A) across capacitor 224 is sensed with a comparator 224 (e.g. 224A in FIG. 3C) that generates a pulse-width modulation (PWM) signal 226 representative of the capacitor state-of-charge. The PWM signal 226 is fed back to control logic 230 (here shown as part of digital baseband processor 204), which selects, via command signal 228, a suitable switch configuration ($b_1$, $b_2$, and their complements in FIG. 3A) to both generate the required level $V_{DS}$ 242 and regulate the voltage 334 across the capacitor. Because the $I_{DS}$ current 246 (see FIG. 3A) is always entering the PA 210 drain (fast transient aside), it is necessary to design a switch network 220 capable of reversing the $I_{DS}$ 246 direction through the flying capacitor 224. This can be accomplished with several topologies (see FIGS. 3A, 6, and 7). IF signal 234 is upconverted 206 with carrier frequency 236, resulting in RF signal before amplification 237. Driver 208 provides $RF_{IN}$ 238 to PA 210. 244 is ground.

FIGS. 3A, 3B, 3C, and 4 illustrate the operation of a first embodiment of the present invention. FIG. 3A shows a flying-capacitor multi-cell supply modulator 202A with feedback regulation with a dynamically varying load (RFPA 210A). This embodiment generates $V_{DS}$ 242 comprising three voltage levels 0, $V_{DC}/2$, and $V_{DC}$ with a single external supply VDC 240. The control bits ($b_1$, $b_2$, and their complements) are selected as shown in FIG. 2 to keep the flying-capacitor 222 voltage $V_{FLY}$ 334 regulated to the set-point $V_{DC}/2$. The embodiment of FIG. 3A uses a single flying-capacitor 224 $C_{FLY}$ with a switch network 220A controlled by the bits $b_1$, $b_2$, and their complements (via command signal 228).

Circuit operation of the embodiment of FIG. 3A is summarized in FIG. 3B. When the output voltage is 0 or $V_{DC}$, no regulation of the flying capacitor is accomplished. When an intermediate level is selected, $V_{FLY}$ can be regulated upward or downward through $I_{FLY}$ ({$b_1, b_2$}={1, 0}) or its reversal ({$b_1, b_2$}={0, 1}). Thus, when bits $b_1$, $b_2$, are both 0, $V_{DS}$=0. When both are 1, $V_{DS}$=$V_{DC}$. In this embodiment, $V_{FLY}$=$V_{DC}/2$ and so when either $b_1$ or $b_2$ is 0 and the other is 1, $V_{DS}$=$V_{DC}/2$. In other embodiments $V_{FLY}$ could be set to other values.

FIG. 3C shows an embodiment of a flying-capacitor sensing circuit 224A realized with a high-impedance voltage divider and comparator 340 with hysteresis. The output is a PWM waveform $V_{PWM}$ 226 representative of the state-of-charge of $C_{FLY}$ 222B, $V_{FLY}$ 334. For $V_{DC}$=20 V and a ripple of 100 mV, the resistor 338 values are $R_1$=261 kΩ, $R_2$=384 Ω, and $R_3$=38.4 kΩ.

Figure 4:
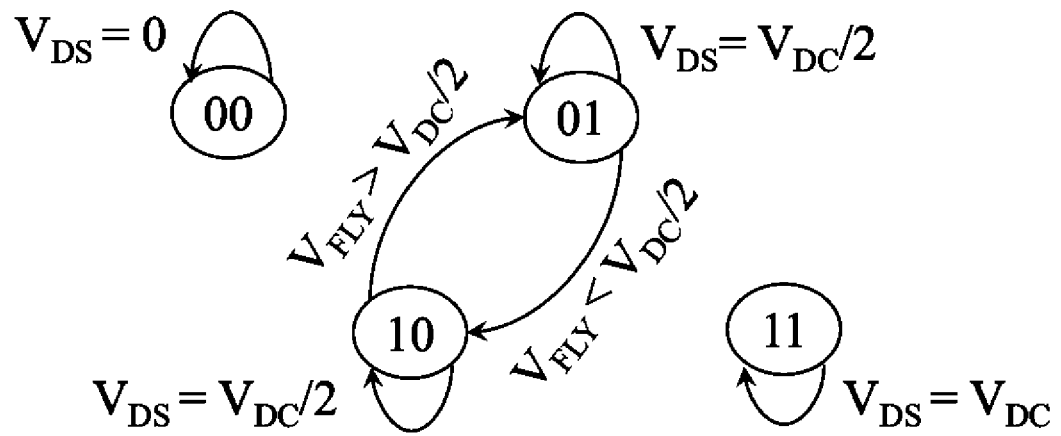
FIG. 4 is a state machine illustrating the operation of the embodiment of FIGS. 3A-C.

This control is implemented in the finite-state machine (FSM) shown in FIG. 4 (see control logic 230 in FIG. 2). Assuming that $V_{FLY}$ 334 has already reached the set-point, $V_{FLY}$=$V_{DC}/2$, the three outputs are 0, $V_{DC}/2$, and $V_{DC}$. Two redundant states ("01" and "10") are used to keep $V_{FLY}$ regulated at $V_{DC}/2$.

Figure 5:
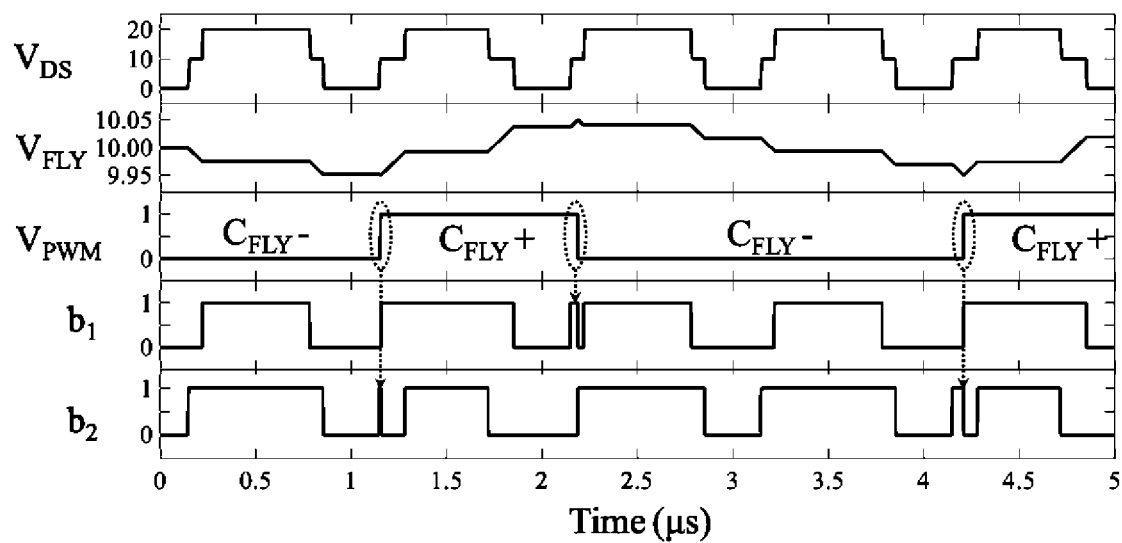
FIG. 5 is a set of plots illustrating the simulated performance of the embodiment of FIGS. 3A-C.

FIG. 5 shows plots from a simulation with ideal components showing the operation of the embodiment of FIGS. 3A-4. A 3-level sinusoid $V_{DS}$ 242 is generated. The waveform $V_{FLY}$ 334 shows the ripple voltage around the set-point (10 V) which is regulated by the FSM. The performance of the multi-cell modulator 202A, sensing circuit 224A and FSM of FIGS. 3A-3C were simulated in Powersim PSIM with ideal components and resistive load. A three-level control signal consisting of a 1-MHz discretized sinusoid was applied at the input of the FSM. The voltage $V_{FLY}$ is sensed by the comparator 224, which generates a PWM signal 226. This is fed back to the FSM control logic 230 to select the bit configuration $b_1$, $b_2$ based on the drain voltage $V_{DS}$ and the state-of-charge of the flying capacitor (via command signal 228). Once the set-point is reached, the plots shown in FIG. 5 show stable regulation of the flying capacitor within 100-mV ripple voltage.

Figure 6:
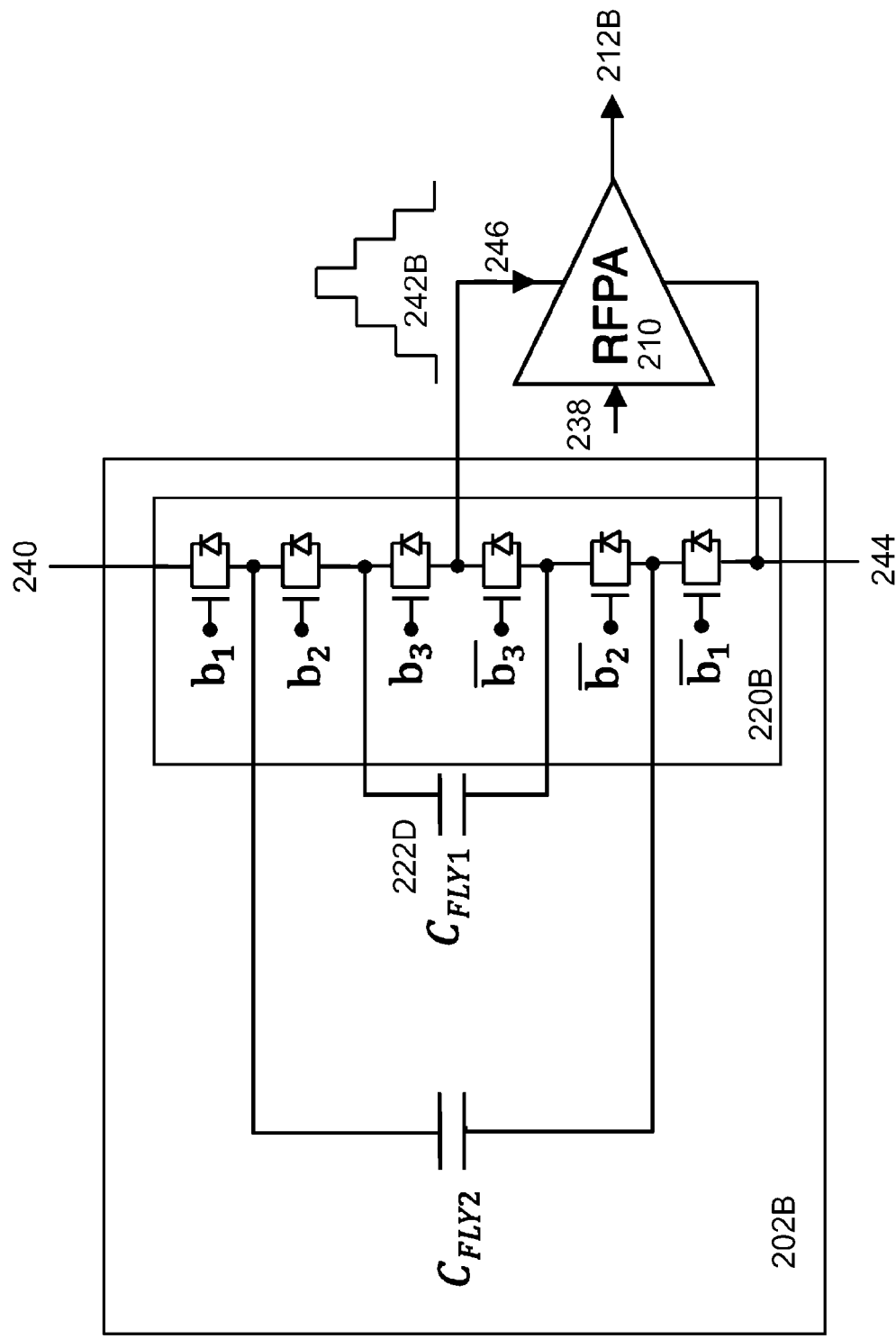
FIG. 6 is a schematic block diagram of an embodiment of a supply modulator with multiple flying capacitor according to the present invention.

FIG. 6 is a schematic block diagram of a supply modulator 202B with two flying capacitors 222C, 222D. Switch network 220B is correspondingly more complex with six switches, and $V_{DS}$ 242B has more output levels (four). This configuration is very similar to a three-cell multilevel modulator, except that it uses only one independent DC power supply. In this configuration N half-bridges are nested and supplied by N−1 flying capacitors. In FIG. 6, N=3, so there are three bits ($b_1$, $b_2$, $b_3$, and their complements), and two flying capacitors 222C and 222D. In general, at least N+1 discrete levels are available for N half bridges and N−1 flying capacitors.

Figure 7:
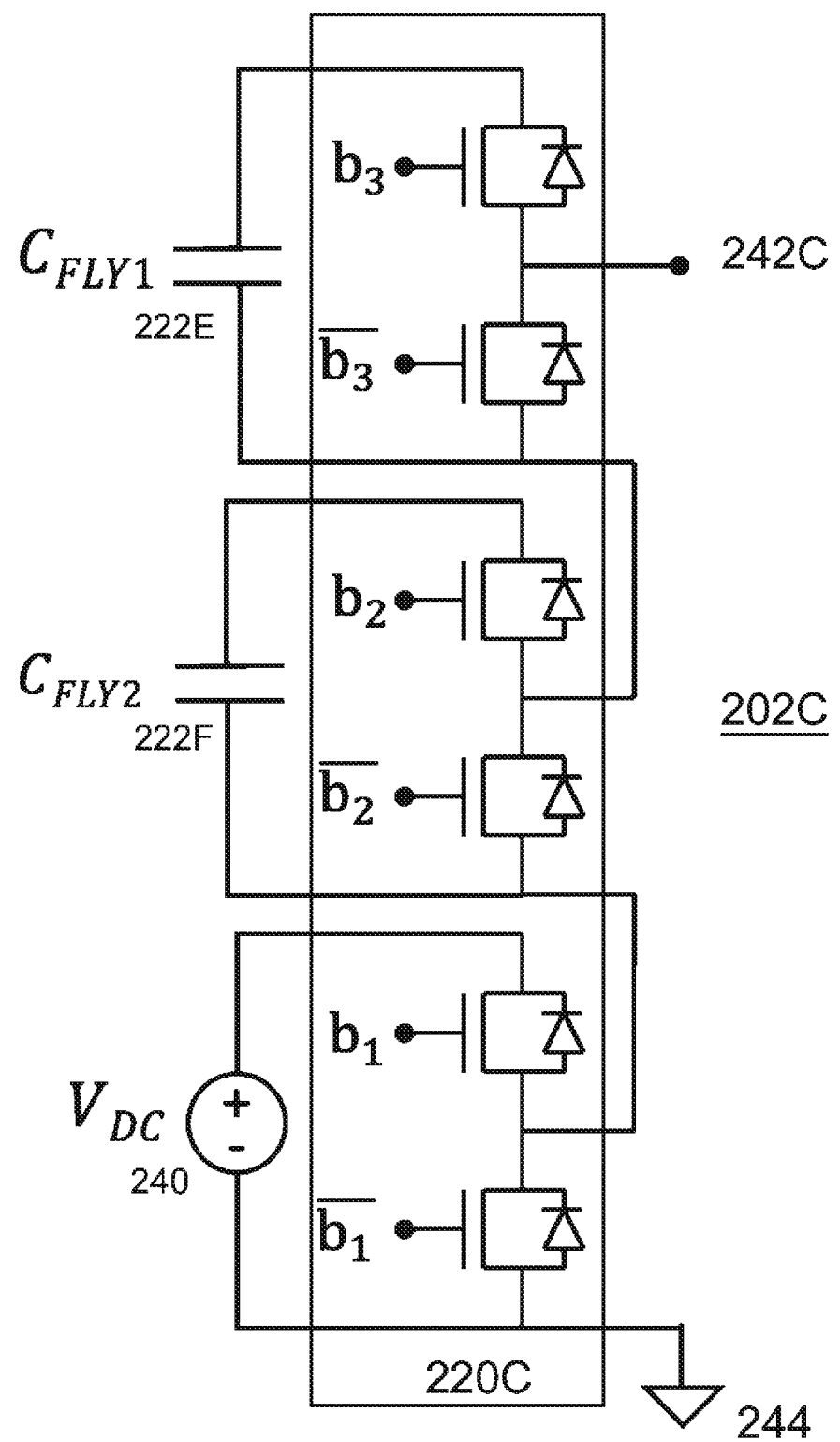
FIG. 7 is a schematic block diagram of another embodiment of a supply modulator with multiple flying capacitor according to the present invention.
Figure 8:
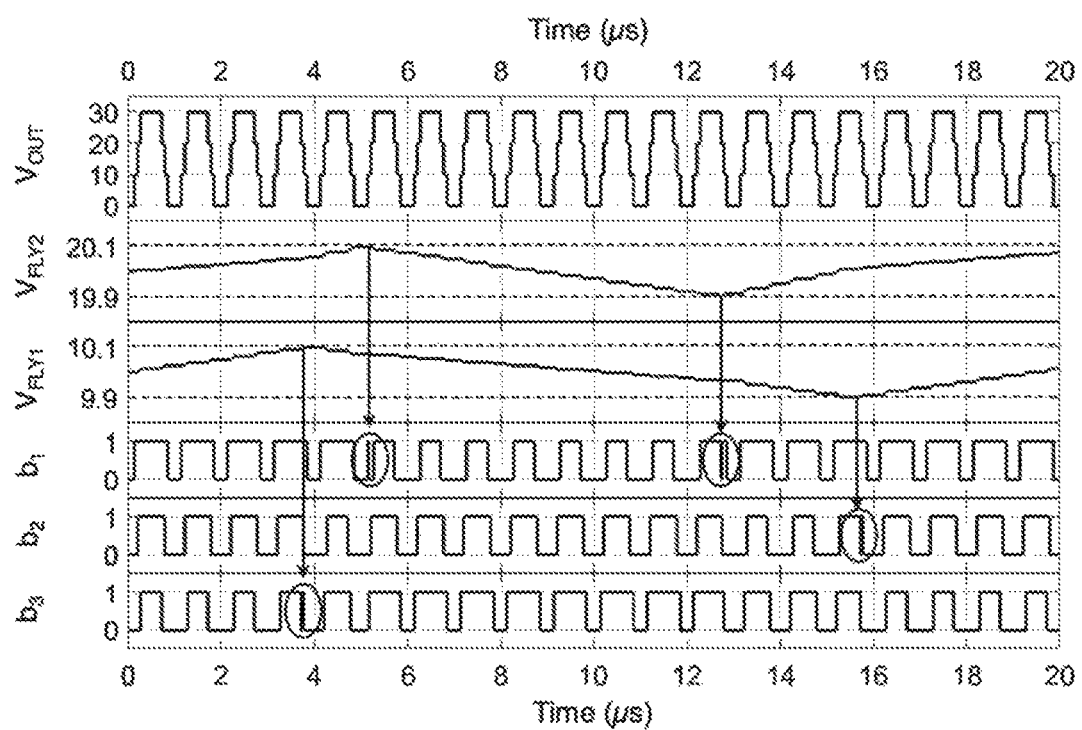
FIG. 8 is a series of plots illustrating the performance of the embodiment of FIG. 6.

FIG. 7 is a schematic block diagram of a supply modulator 202C with two flying capacitors 222E, 222F. Switch network 220C includes six switches in a series half-bridge configuration, and $V_{DS}$ 242C has four levels. As in the case of FIG. 6, four variable DC voltage levels are supplied to amplifier 210.

A prototype of multi-cell modulator as shown in FIGS. 3A-4 was realized with a 4-layer FR4 board. GaN-on-Si normally-off transistors (EPC 2014C) and GaN-specific gate drivers (TI LM5114) were selected. The external low-power driver supply $V_{DRV}$=6 V was distributed in the circuit with a diode-capacitor bootstrap technique. The flying capacitor was a 20-μF ceramic component and was placed on the bottom side of the board for low loop parasitics. The voltage across $C_{FLY}$ was sensed with a low power consumption comparator 224 (Microchip 841) which generated the PWM feedback signal 226. The control 230 of the power switches 220 was performed with four high-speed digital isolators within digital baseband processor 204: the top two were monodirectional (Si Labs 8610), while the other two were bidirectional (Si Labs 8622) to allow the PWM feedback signal. The active area of the circuit was 11 mm_50 mm. Only part of the circuit was used (four switches instead of six).

The supply modulator was connected to a single-stage MMIC PA 210 designed in the Qorvo 0.15-μm GaN-on-SiC process for efficient operation at X-band. At a nominal supply voltage of 20 V and a quiescent drain current of 60 mA, a peak output power of 34 dBm was measured with a drain efficiency of 55% at 10.2 GHz. At the peak input power of 27 dBm, $I_{DS}$ peaked to 210 mA. The small-signal gain was 10.7 dB. The MMIC PA was mounted on a Rogers TMM10i substrate which provided gate supply bypassing and connection to the modulator. FIGS. 9-16 illustrate the measured performance of the prototype device shown in FIG. 3A and described above.

Figure 9:
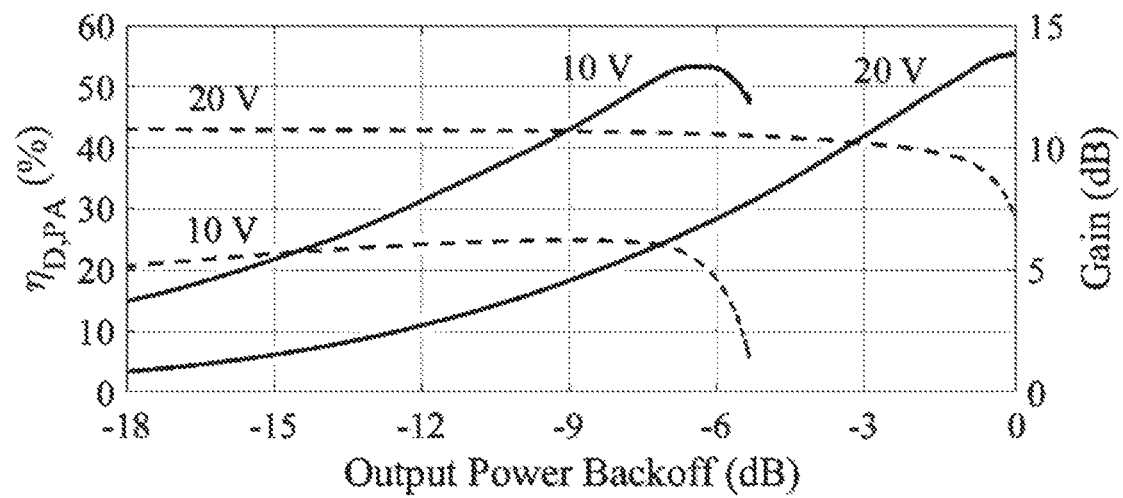
FIG. 9 is a plot of measured pulsed drain efficiency and gain for the device of FIG. 3A.

FIG. 9 illustrates PA 210 characterization for the embodiment of FIG. 3A at $V_{DC}$=20 V and $V_{DC}/2$=10 V. The dependence of gain on supply voltage, characteristic of GaN, needs to be corrected with DPD. Measured pulsed drain efficiency (continuous) and gain (dashed) of the PA is shown at 10.2 GHz for 10 and 20V supplies. More than 22 percentage point improvement is observed between 6 to 10 dB back-off (the PA is optimized for drain voltages between 10 and 20 V).

Figure 11:
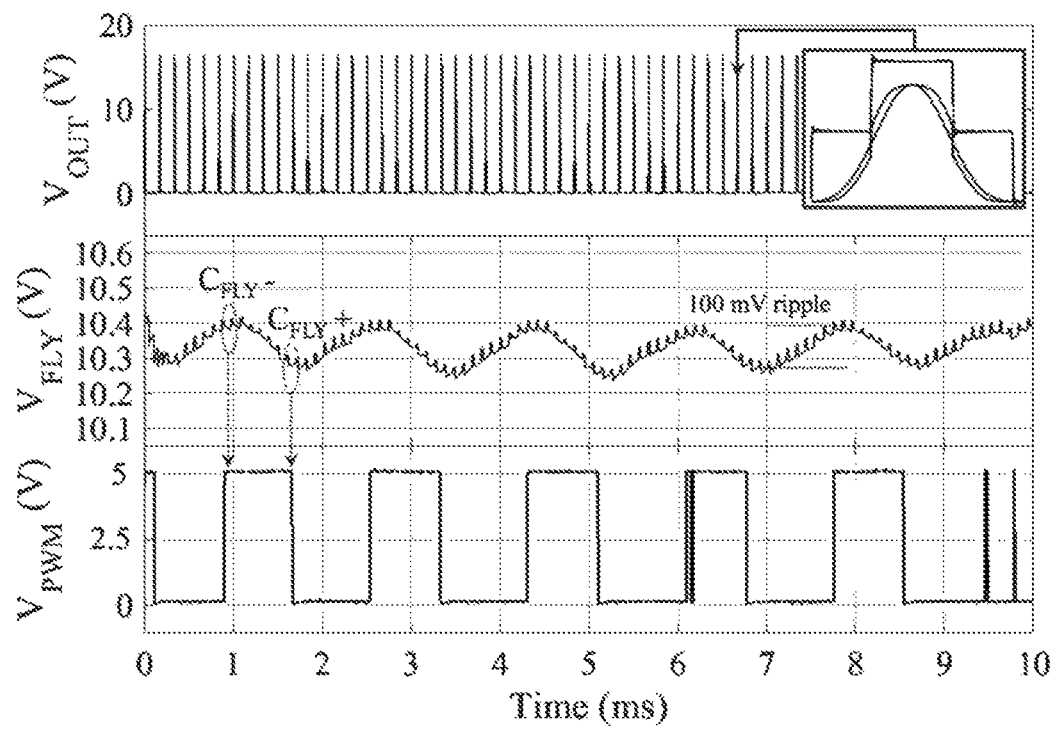
FIG. 11 is a series of plots illustrating measured waveforms after startup of the device of FIG. 3A.

The operation of the circuit was verified by supply modulating the PA. An 80-MHz bandwidth vector signal transceiver (NI VST 5645R) with X-band frequency extension was used to test the system. The FSM was mapped in the FPGA within the VST for real-time control of the voltage feedback. The closed-loop system was stable as long as the sum of delays in the feedback loop was a small part of the RC time constant, where R=$V_{DS}/I_{DS}$. This condition can be easily satisfied with typical load values because $C_{FLY}$ 222 can be arbitrarily modified at the expense of a slower start-up time. As in other dc/dc converters, the start-up time is required to charge $C_{FLY}$ and the switch driver capacitors before normal operation. This happens as follows: the FPGA generates the bit sequence (i.e., voltage staircase) and this activates a soft-startup of components including drivers 208, comparator 224, and isolators as shown in FIG. 11 (t=0 to 25 ms). After the driver start-up (t=0 to 2.5 ms), the switch network regulates $V_{FLY}$ to $V_{DC}/2$.

Figure 10:
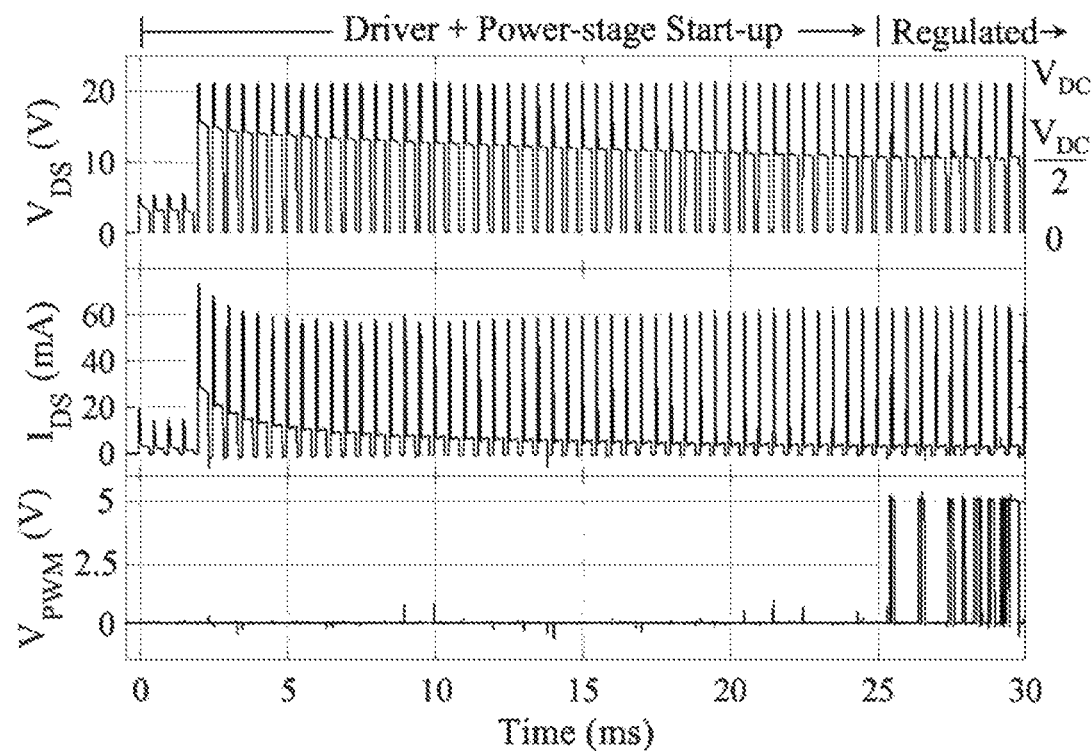
FIG. 10 is a series of plots illustrating measured waveforms of the startup of the device of FIG. 3A.

FIG. 10 illustrates the startup process for the embodiment of FIG. 3A. Shown are measured waveforms for the start-up of the supply-modulated PA. At t=0 ms, the driver capacitors and CFLY are discharged. The FSM generates commands to charge the capacitors to VDC/2 through the bias current at VDS of the PA. During the start-up, no RF signal is amplified by the PA (only quiescent current present).

Note that this start-up time is only required at the turn-on of the supply-modulated PA and is not necessary once the circuit is operating. Additionally, no RF signal amplification is required during the start-up phase as only the PA quiescent current charges the flying capacitor. Hence, the start-up duration is dependent on the RC time constant.

FIG. 11 shows the significant measured waveforms of the embodiment of FIG. 3A once it reaches stable regulation and has started to regulate $V_{FLY}$: $V_{OUT}$ is the PA RF output with Gaussian envelope and with drain modulation as 0-10-20-10-0 V and DPD enabled (7 dB of linearized gain). The intermediate voltage level shows stable behavior around 10.35 V, kept within a 100 mV ripple by the PWM feedback (about 500 Hz commutation rate). At t=0 ms, both the driver's capacitors and CFLY are discharged. The FSM generates the digital commands that initiate the charge of these capacitors to the selected set-point ($V_{DC}/2$) through the bias current at $V_{DS}$ of the PA.

Radar pulses and an OFDM signal are used to test the supply-modulated PA. Given the a-priori knowledge of waveforms in radar transmitters, an iterative linearization technique is utilized to compensate for PA non-idealities and provide a best-case performance estimation with DPD. Rectangular pulses and other Gaussian-like shapes are considered for this comparison. The duration of the pulses is varied to obtain the same average RF output power $P_{OUT,AVG}$ with the period kept fixed to 100 µs. Average drain efficiency $\eta_{D,AVG}=P_{OUT,AVG}/P_{DC}$ is used to evaluate the performance of the PA including also the supply modulator losses.

Figure 12:
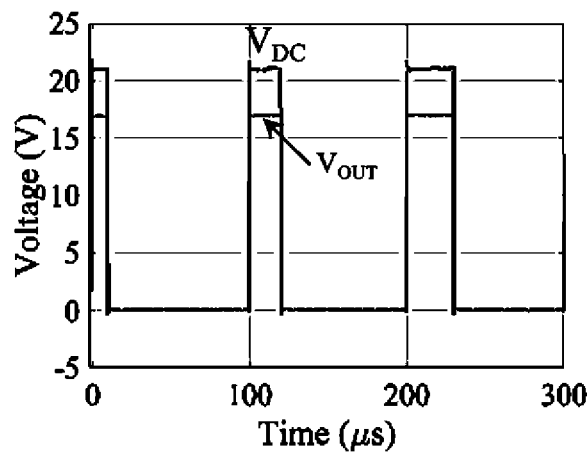
FIG. 12 is a plot of time domain square pulses for variable duty cycle for the device of FIG. 3A.

FIGS. 12-16 show time and frequency domain output for the embodiment of FIG. 3A of the amplifier for rectangular, Blackman, and OFDM sequences with 5-MHz bandwidth and 6-dB PAPR. FIG. 12 shows time domain rectangular pulses with variable duty cycle (10%, 20%, and 30%) and 100-µs repetition period.

Table 2 is a result summary for different radar waveforms with fixed average output power and 100-µs repetition period. It provides a compilation of measurements performed with different windowing functions for radar applications. A comparison is made between a typical rectangular drain voltage pulse (i.e., "Rect.+DPD" case) and supply modulation (i.e., "SM+DPD" case) with regard to linearity and efficiency.

TABLE 2

| Waveform | | | Supply-Modulated PA | | Linearity | | Efficiency |
|---|---|---|---|---|---|---|---|
| Window | Supply | Duration | $P_{OUT,AVG}$ | $P_{DC}$ | NRMSE | 1$^{st}$ spectral sidelobe | $\eta_{D,AVG}$ |
| Rectangular | Rectangular | 10 µs | 240 mW | 460 mW | 1.2% | −13 dB | 52% |
| Raised Cosine | Rect. + DPD | 27 µs | 235 mW | 734 mW | 0.9% | −32 dB | 32% |
| Raised Cosine | SM + DPD | 27 µs | 236 mW | 548 mW | 1.1% | −32 dB | 43% |
| Triangular | Rect. + DPD | 30 µs | 237 mW | 846 mW | 0.8% | −28 dB | 28% |
| Triangular | SM + DPD | 30 µs | 240 mW | 615 mW | 1.3% | −28 dB | 39% |
| Blackman | Rect. + DPD | 33 µs | 232 mW | 859 mW | 1.0% | −56 dB (−58 dB ideal) | 27% |
| Blackman | SM + DPD | 33 µs | 235 mW | 652 mW | 1.5% | −55 dB (−58 dB ideal) | 36% |

Figure 13:
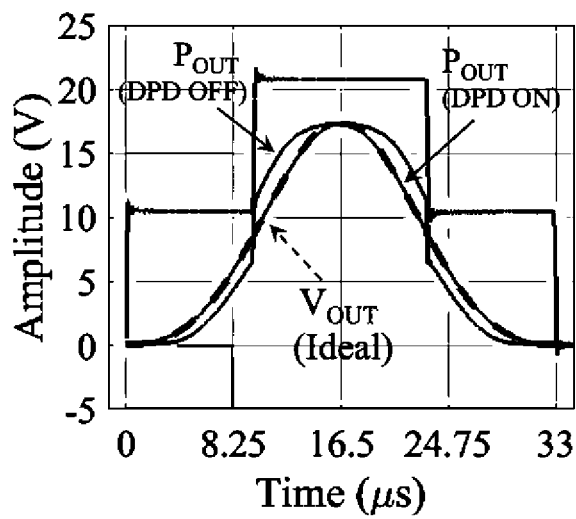
FIG. 13 is a plot showing a time domain Blackman pulse from the device of FIG. 3A
Figure 14:
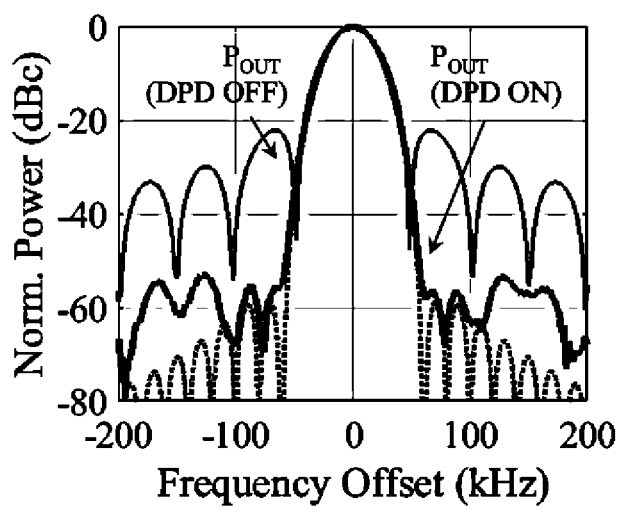
FIG. 14 is a plot showing ideal and measured spectra of the device of FIG. 3A

FIG. 13 shows the time domain Blackman pulse given 100 µs repetition period. FIG. 14 shows ideal and measured spectra for a 10% Blackman pulse and 100 µs repetition period.

Figure 15:
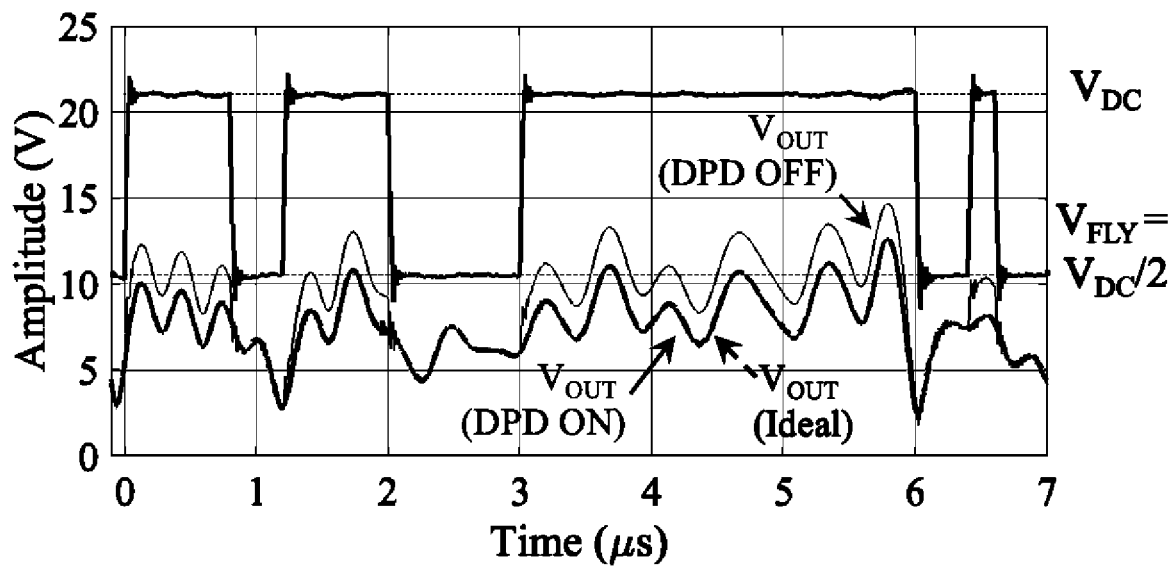
FIG. 15 is plot showing a time-domain representation of the device of FIG. 3A
Figure 16:
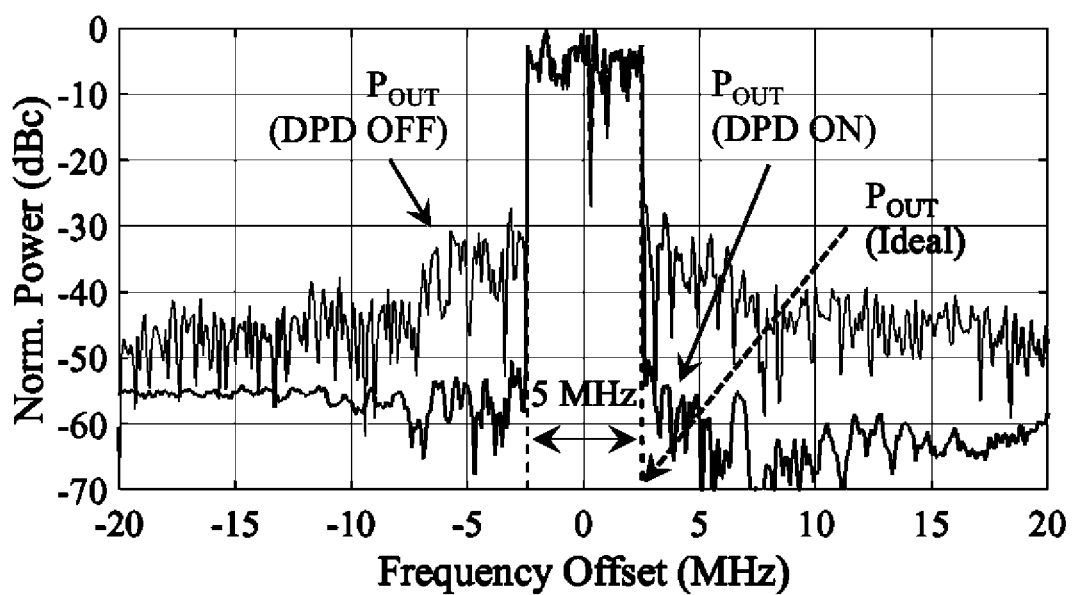
FIG. 16 is plot showing a frequency-domain representation of the device of FIG. 3A.

FIG. 15 shows a time-domain representation of 10 µs long OFDM signal with 6-dB PAPR and 5-MHz bandwidth. FIG. 16 shows the frequency domain OFDM signal. Even for highly variable signals, the FSM is capable of regulating $V_{FLY}$ to $V_{DC}/2$. Low distortion is achieved by iterative learning DPD.

Up to 11 percentage points of improvement were observed for the radar waveforms with normalized root mean square error (NRMSE) linearity recovered with DPD. The 5-MHz 6-dB PAPR OFDM signal achieves improvement of about 14 percentage points as compared to the fixed $V_{DC}$ case. These results also include the modulator efficiency as well as the synthesis of the intermediate voltage $V_{DC}/2$.

While the exemplary preferred embodiments of the present invention are described herein with particularity, those skilled in the art will appreciate various changes, additions, and applications other than those specifically mentioned, which are within the spirit of this invention. For example, this approach is amenable to monolithic integration, and has the potential of wider bandwidth operation.

What is claimed is:

1. A multi-cell supply modulator for providing variable-voltage DC power to an RF power amplifier comprising:
   a single independent DC voltage supply supplying power at a DC supply voltage;
   a switch network connected between the DC voltage supply and the power amplifier and configured to provide power at variable, discrete DC voltages to the power amplifier;
   a flying capacitor connected to switches in the switch network;
   a sensing circuit for detecting a flying voltage across the flying capacitor and providing a feedback signal based on the flying voltage;
   control circuitry for controlling the switch network based upon the feedback signal;
   wherein the switch network is configured to provide at least three different DC voltage levels to the RF power amplifier, and a second flying capacitor connected to switches in the switch network and wherein the switch network is configured to provide at least four different DC voltage levels to the RF power amplifier.

2. The supply modulator of claim 1 wherein the variable discrete DC supply voltages substantially vary between the DC supply voltage, a ground voltage, and a level halfway between the DC supply voltage and the ground voltage.

3. The supply modulator of claim 1 wherein the sensing circuit comprises a comparator with hysteresis.

4. The supply modulator of claim 1 wherein the sensing circuit comprises a comparator with hysteresis.

5. The supply modulator of claim 1 wherein the switch network comprises three nested half bridges.

6. The supply modulator of claim 1 wherein the switch network comprises N nested half bridges and N−1 flying capacitors, and wherein the switch network is configured to provide at least N+1 different DC voltage levels to the RF power amplifier.

7. The supply modulator of claim 1 wherein the switch network comprises three series half bridges.

8. The supply modulator of claim 1 wherein the switch network comprises N series half bridges and N−1 flying capacitors, and wherein the switch network is configured to provide at least N+1 different DC voltage levels to the RF power amplifier.

9. The supply modulator of claim 1 wherein the switch network, the flying capacitor, and the sensing circuit are integrated on a single chip.

10. The supply modulator of claim 9 wherein the single chip is GaN architecture.

11. The supply modulator of claim 1 further comprising a digital baseband configured to supply an IF signal to be upconverted to RF and amplified by the RF amplifier.

12. The supply modulator of claim 11 wherein the sensing circuit comprises a comparator with hysteresis.

13. The supply modulator of claim 11 wherein the digital baseband is further configured to perform digital predistortion on the IF signal.

14. The supply modulator of claim 11 wherein the control logic and the digital baseband comprise a digital baseband processor.

\* \* \* \* \*